United States Patent [19]

Higashi et al.

[11] Patent Number: 4,914,742

[45] Date of Patent: Apr. 3, 1990

[54] THIN FILM ORTHOGONAL MICROSENSOR FOR AIR FLOW AND METHOD

[75] Inventors: Robert E. Higashi, Shorewood; James O. Holmen, Minnetonka; Steven D. James, Edina; Robert G. Johnson, Minnetonka; Jeffrey A. Ridley, Burnsville, all of Minn.

[73] Assignee: Honeywell Inc., Minneapolis, Minn.

[21] Appl. No.: 129,204

[22] Filed: Dec. 7, 1987

[51] Int. Cl.$^4$ .................... H01L 29/84; H01L 29/96
[52] U.S. Cl. ........................................ 357/26; 357/51; 73/204.16; 73/204.26
[58] Field of Search ............... 357/26, 25, 51; 73/725, 73/726, 727, 204.16, 204.19, 204.26

[56] References Cited

U.S. PATENT DOCUMENTS

| | | | |
|---|---|---|---|
| 4,682,503 | 7/1987 | Higashi et al. | 73/204.26 X |
| 4,766,666 | 8/1988 | Sugiyama et al. | 73/727 X |

FOREIGN PATENT DOCUMENTS

| | | | |
|---|---|---|---|
| 62-76784 | 4/1987 | Japan | 357/26 |
| 62-76785 | 4/1987 | Japan | 357/26 |

OTHER PUBLICATIONS

Wert et al., *Physics of Solids*, McGraw-Hill, 1970, pp. 23–27.

S. Sugiyama et al., "Micro-Diaphragm Pressure Sensor", IEDM 1986, pp. 184–187.

Primary Examiner—Edward J. Wojciechowicz
Assistant Examiner—Sara W. Crane
Attorney, Agent, or Firm—Gregory A. Bruns

[57] ABSTRACT

A microbridge air flow sensor which has a sealed etched cavity beneath the silicon nitride diaphragm so that the cavity is not susceptible to contamination from residual films or other material accumulating within the cavity. The cavity thermally isolates the heater and detectors which are encapsulated in the diaphragm. The cavity is fabricated by front side etching of the silicon wafer. Narrow slots are made through the silicon nitride diaphragm to expose a thin film (400 angstrom) rectangle of aluminum. A first etch removes the aluminum leaving a 400 angstrom very shallow cavity under the diaphragm. Anisotropic etch is then introduced into the shallow cavity to etch the silicon pit.

7 Claims, 3 Drawing Sheets

THIN FILM ORTHOGONAL MICROSENSOR FOR AIR FLOW AND METHOD

BACKGROUND AND SUMMARY OF THE INVENTION

The invention is directed to the field of microsensor mass air flow devices and a method of fabricating the devices. The structure at an intermediate point of fabrication is a single crystal silicon substrate chip having on a portion of the surface a thin sacrificial layer of aluminum or other selectively etchable layer which delineates the future location of a diaphragm to be formed at a later step. The sacrificial layer of aluminum and the rest of the silicon chip surface are coated with a thin film of silicon nitride which forms the diaphragm. By sacrificial is meant a layer which is removed at a later stage in the fabrication process.

A microbridge air flow sensor is needed that is not susceptible to contamination from residual films or other material accumulating within the etch pit or cavity which thermally isolates the heater and detectors. It is also needful to fabricate the device by front side etching and to have the silicon chip edges oriented orthogonally to the air flow direction.

In the prior art of sealed-off silicon nitride micro-diaphragms having an etched cavity beneath the diaphragm, there is a publication by S. Sugiyama et al of Toyota Central Research Labs entitled "Micro-Diaphragm Pressure Sensor", IEDM 1986, pages 184–187. In that disclosure a micro-diaphragm pressure sensor with silicon nitride diaphragm of 80 micron x 80 micron was fabricated by applying micromachining technique. A main feature was said to be that a planar type pressure sensor was formed by single-side processing solely on the top surface of (100) silicon wafer. The diaphragm and a reference pressure chamber are formed by undercut-etching of the interface between the diaphragm and the silicon substrate. A 1500Å thick interlayer, such as polysilicon, is formed on the interface, that is, on the silicon surface and under the diaphragm. An etch hole(s) is/are opened in the diaphragm to the polysilicon and an anisotropic etchant KOH is used to remove the polysilicon interlayer and to anisotropically etch the silicon substrate under the diaphragm.

Although there are similarities between the Sugiyama pressure sensor diaphragm structure and the flow sensor structure of the present invention, there are nevertheless major differences between them such that the present invention could not be fabricated by the method taught by Sugiyama. They are similar in that both structures make use of a layer of a sacrificial material that is etched away in the fabrication of the device, both use front surface etching, and both have an anisotropically etched pit in the silicon beneath the diaphragm containing the sensing resistors.

One of the significant differences is that the Sugiyama etch pit has about 6 percent of the surface area and about one to two percent of the volume of the pit of the subject invention. Furthermore the Sugiyama diaphragm has no heater and need not be heated, whereas the subject invention flow sensor diaphragm has an embedded heater element and must be heated, typically to 160° C. above the silicon chip ambient temperature.

Thirdly, the Sugiyama pressure sensor is fabricated with a single etchant and a single etch step to remove both the polysilicon sacrificial layer and the silicon from the pit volume to give a pyramidal shaped pit. As will be described in detail, the subject invention is fabricated using one acid etchant to selectively remove only a metallic sacrificial layer, followed by a different alkaline anisotropic etchant to selectively remove only the silicon pit material. This enables the accurate fabrication of a large, shallow, flat bottomed pit without penetrating all the way through the thin b 0.010' wafer required for the flow sensor. Such a pit is not obtainable by the Sugiyama technique in which the resulting pyramidal pit would penetrate all the way through the thin wafer when making the large area pit of the subject invention. Penetration through the entire thickness of the wafer is unacceptable because the chip is weakened, and because the epoxy or solder used to cement the chip to its package can then well up into the pit and change the thermal conductance in an unpredictable way.

The Sugiyama pressure sensor requires a permanently evacuated cavity and therefore requires a hermetic seal which is obtained by plasma depositing an impermeable silicon nitride layer at very low pressure to seal a narrow etch channel that is only 0.15 microns wide. On the other hand, the subject invention requires a cavity sealed only to the extent that dust and liquids are excluded, and it is necessary to have the pressure within the pit approximately atmospheric to avoid rupturing the diaphragm and changing the thermal efficiency of the heated diaphragm significantly.

The narrow 0.15 micron wide etch channels of Sugiyama would not allow enough access for the etchant to etch out the large cavity of the subject invention in a practical length of time. Therefore the subject invention uses an array of slots in the silicon nitride diaphragm, each slot being typically 2.0 microns wide and 5 to 50 microns long and only about one micron deep. This array of slots provides adequate access for the sequentially used etchants to remove the sacrificial metallic layer and to etch out the pit in a practical length of time.

The 2.0 micron wide slots of the present invention access the pit vertically through the approximately one micron thickness of the diaphragm nitride, whereas the 0.15 micron wide channels of the Sugiyama device extend horizontally over several microns to reach the cavity. The Sugiyama 0.15 micron channels are sealed off by building up vertically a layer of nitride across the outlet of the channel. In this process the rate of closure of the channel is constant because the nitride molecules always have direct access to the horizontal deposition surfaces. However, with the Sugiyama method of plasma deposition of silicon nitride, it is impossible to seal off the the slots of the subject invention that are 2.0 microns wide in a practical length of deposition time. This is because the plasma nitride accumulates even more slowly on the vertically oriented sides of the slots as they close, the nitride molecules tending to come to rest on the outer, more horizontal surfaces before reaching the inner closing surfaces. Therefore, in the subject invention, the slots are sealed with a thin layer of a viscous polyimide solution which is flowed rapidly over the surface, then hard-baked to form a mechanically tough, but not absolutely hermetic layer on the diaphragm. This layer can be left intact, or can be delineated to leave polyimide covering only the local areas of the slots.

Thus, because of the relatively larger size of the subject invention and the different cavity shape that is required, a uniquely different structure of the diaphragm and a uniquely different fabrication method is required.

DESCRIPTION

Figure 1:
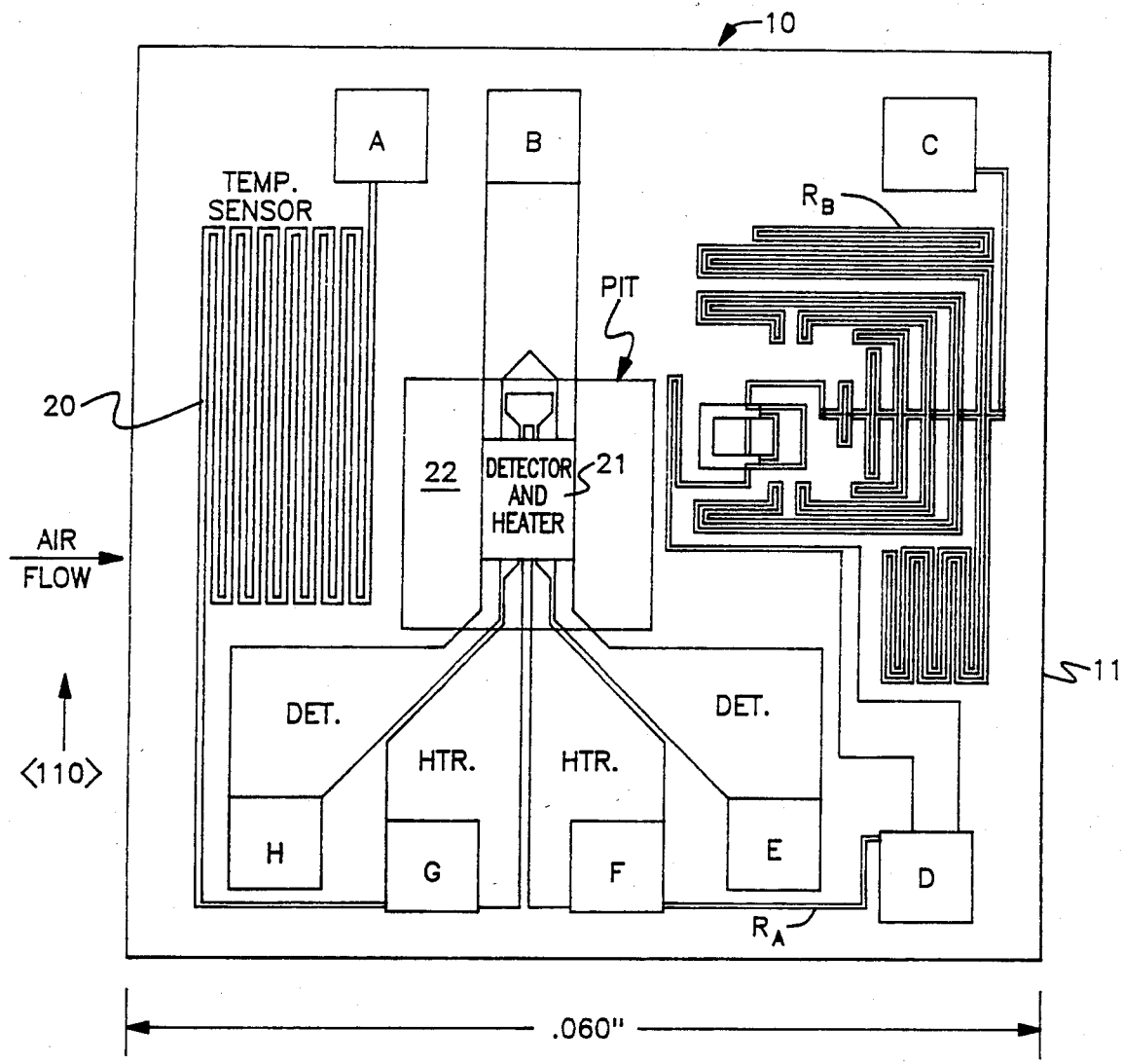
FIG. 1 is a plan view of a microsensor chip according to the invention.
Figure 2:
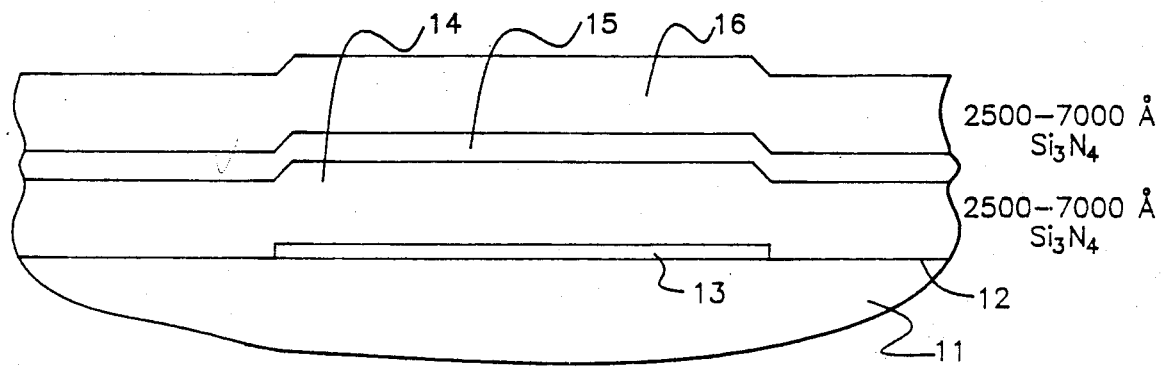
FIG. 2 is an enlarged edge view of a portion of the chip prior to etching the pit in the silicon.

Referring now to FIG. 1 there is shown generally at 10 the top plan view of the thin film microsensor chip for air flow sensing constructed on a (100) monocrystalline silicon chip or wafer substrate 11. Referring momentarily to FIG. 2 there is shown several of the thin film layers which are not apparent in FIG. 1. Furthermore FIG. 2 is the structure at an intermediate step in the fabrication prior to elimination of the sacrificial aluminum layer and etching of a pit in the silicon. The monocrystalline silicon substrate wafer 11 has a (100) planar surface 12 which has first formed thereon a thin sacrificial selectively etchable layer such as of sputter deposited aluminum 13 preferably about 400 angstroms in thickness. In one successful embodiment the layer 13 is a square about 325 microns ($\mu$) on a side. The aluminum defines the location of an area where a shallow pit will later be etched in the silicon. The critical edges of the aluminum delineation are oriented orthogonally to the <110> direction to accurately define the final etch pit boundaries. If a non-orthogonal orientation were used, the aluminum delineation itself would not then limit the boundaries of the etch pit. Over the surface 12 and the aluminum layer 13 is sputter deposited a thin film layer of dielectric 14 such as silicon nitride which may be on the order of 2500 to 7000 angstroms (Å) thick. A thin film electrically resistive layer such as platinum 15 is sputter deposited over the silicon nitride layer 14 and is delineated by conventional techniques into the desired circuit pattern for the chip. The platinum film is preferably on the order of 800 angstroms in thickness. No sloped edge is needed to carry the resistor line over the nitride step because the initial aluminum step is small and can easily be covered with nitride, and the metal resistor line can be deposited over the resulting 400Å vertical nitride step to achieve electrical continuity and chemical passivation. Following delineation of the circuit a further thin film layer 16 of sputter deposited silicon nitride covers the resistive circuit and the layer 14.

Referring back again to FIG. 1 there is shown near the periphery of the chip a number of electrical contact pads A,B,C,D,E,F,G and H. These pads make selective contact to circuit elements on the chip. For example, a resistive temperature sensor 20 extends between pad A and pad G; a resistor $R_A$ extends between pad F and pad D; and a resistor $R_B$ extends between pad C and pad D. The resistor $R_B$ is in the form of a conventional ladder trim network. All of these resistive elements including 20, $R_A$ and $R_B$ as well as a heater and detector (shown as 21) to be described later, are formed in the platinum layer 15, previously identified. The heater and detector 21 are formed in a thin web or diaphragm area 22 over a shallow etched pit in the silicon which is shown in more detail in FIGS. 3, 4 and 5. The pit is typically 100-130 microns deep.

Figure 3:
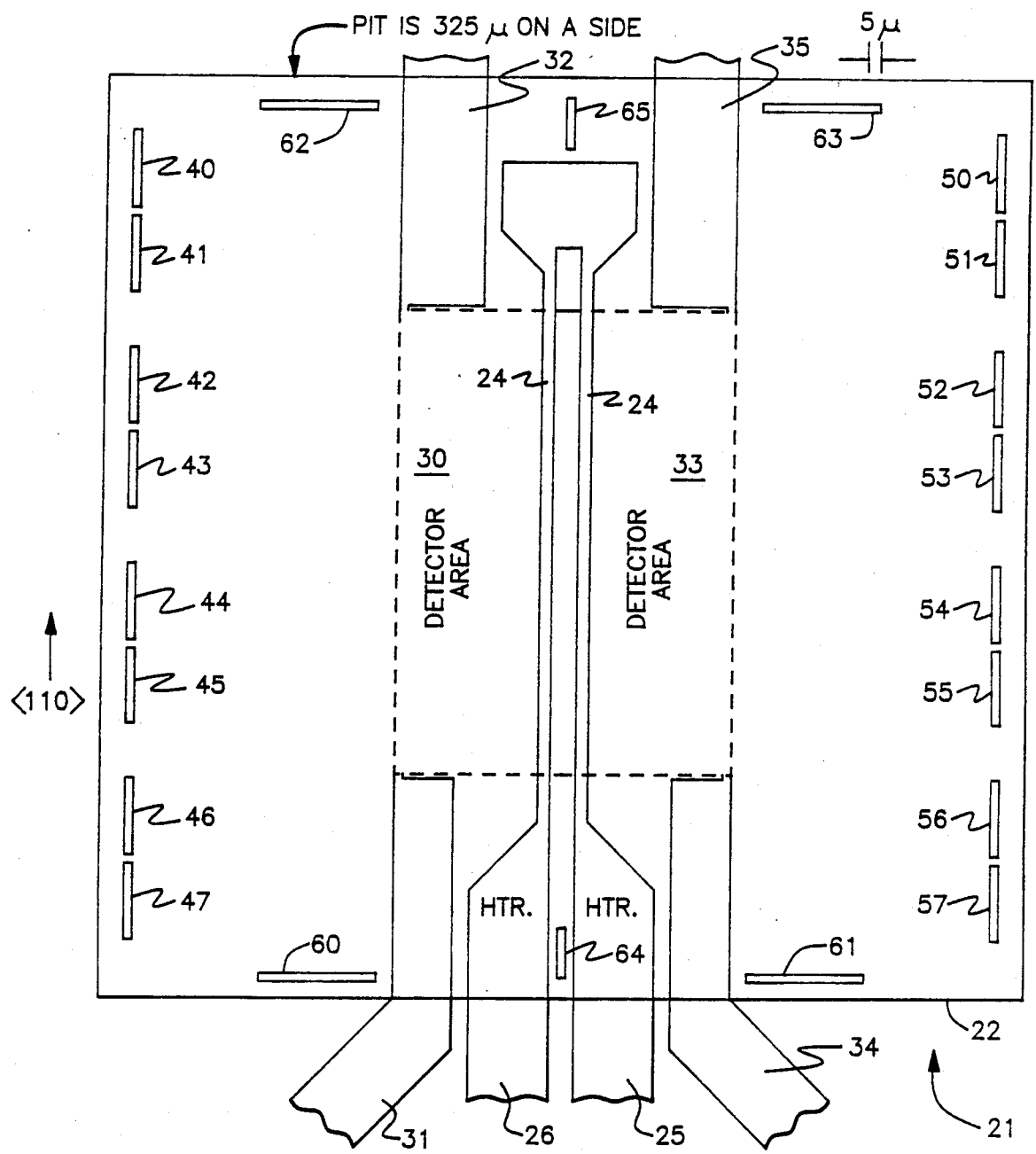
FIG. 3 is a plan view of the diaphragm or web area over the etched pit in the silicon.

In FIG. 3 there is shown a more detailed top plan view of the nitride web area 22 which in one preferred embodiment is about 325 microns on a side. FIG. 3 shows a heater 24 with its leads 25 and 26, an upstream detector area 30 with its leads 31 and 32, a downstream detector area 33 with its leads 34 and 35 and the slots in the nitride web 22 giving access for the sequentially used etchants to selectively attack in order the aluminum and the silicon respectively. The slots 40 to 47 and 50 to 57 at the left and right sides of the web area are positioned somewhat inboard from the aluminum boundary and pit edge (see FIG. 5). Likewise slots 60,61,62,63,64 and 65 are also spaced from the aluminum boundary and pit edge. These slots are all preferably 2 to 4 microns wide as shown at the slot detail of FIGS. 4, 4a and 5.

Figure 4:
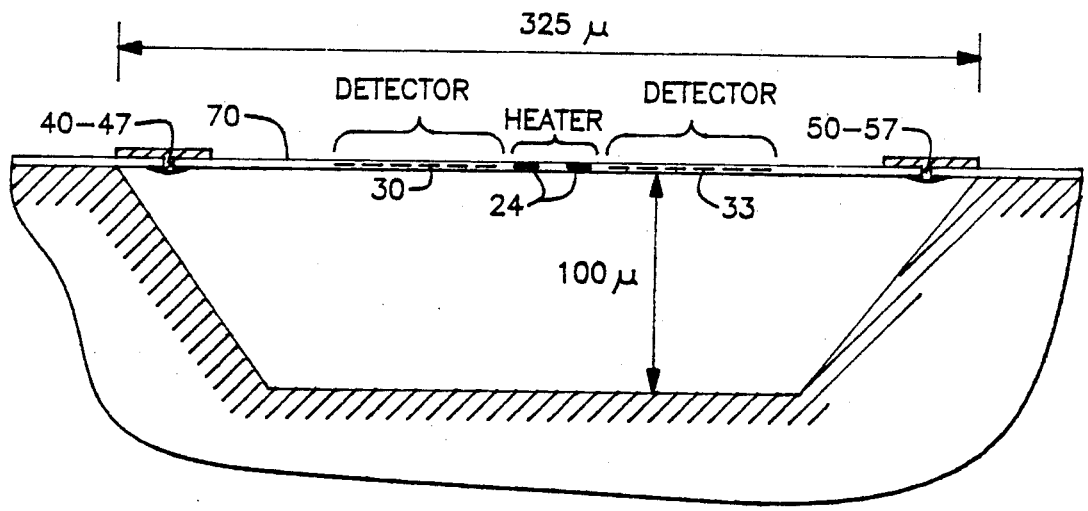
FIG. 4 is a cross section of the diaphragm and etched pit of FIG. 3.
Figure 4A:
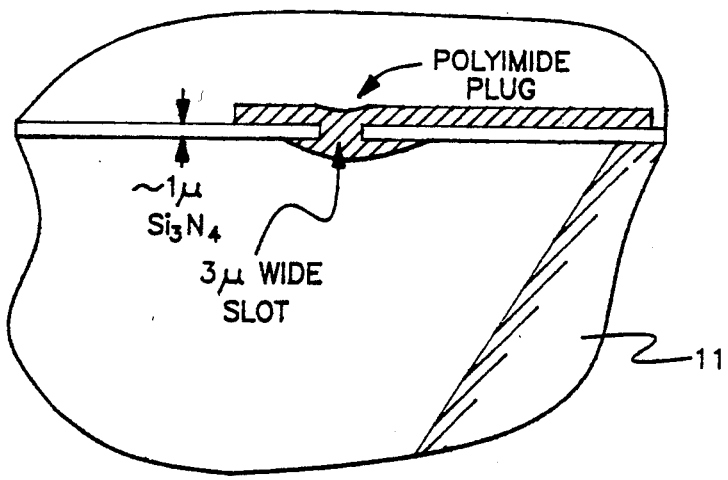
FIG. 4a shows the slot detail and is an enlargement of a portion of FIG. 3.
Figure 5:
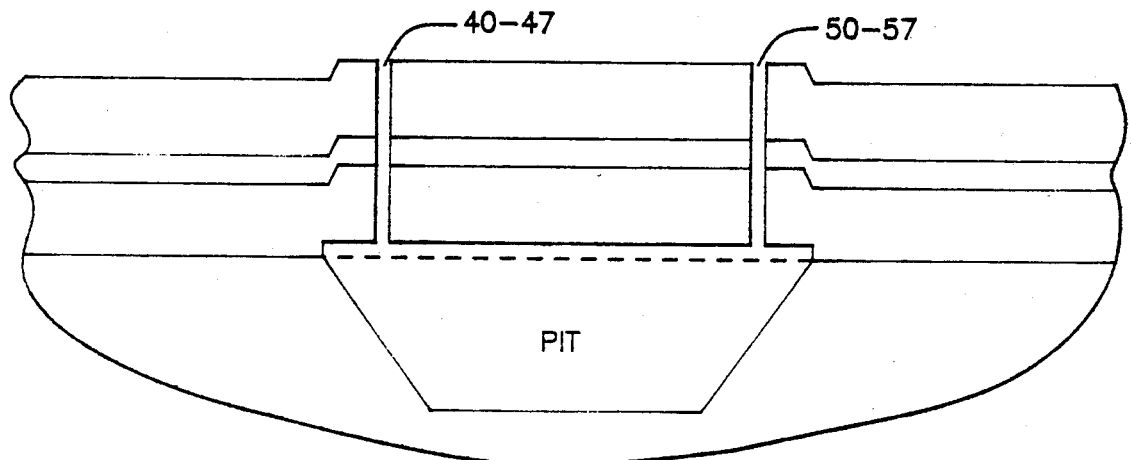
FIG. 5 shows the layer detail, the removal of the aluminum allowing the etching of the pit.

FIG. 4 is a cross-section of the silicon nitride web area 22 shown in FIG. 3. The heater 24 and detectors 30 and 33 and thin encapsulating silicon nitride film 70 on the web area are deposited by conventional thin film techniques as described in earlier patents assigned to the same assignee, such as 4,478,076; 4,478,077; 4,501,144; 4,581,928; and 4,651,564. The invention in this case concerns the type of web structure used and its method of fabrication.

A heated element air flow sensor must retain a constant thermal conductance structure over its life to maintain its initial calibration. The accumulation of contaminating films or dirt underneath the web structure during life can change the conductance to the silicon and cause error in the calibration. An object of the invention is to seal off the pit space beneath the heater and detectors (i.e., the web) to prevent such contamination. It is very desirable and much less costly to accomplish this by doing front rather than back surface etching, which introduces alignment problems, more complex processing and packaging, and a weaker chip structure. It is especially important to have a strong chip because the ideal chip is very thin to provide minimum perturbation of the air flow over it. Consequently, because the etch pit is smaller when etched from the front side, the chip can be made thinner by front side etching, and still have adequate strength.

In this invention the edge of the pit and hence the length of the bridge are determined by the (111) plane stopping action. This is made possible by the orthogonal orientation of the rectangularly delineated aluminum film beneath the orthogonally oriented microbridge structure as in FIG. 3. The aluminum film is completely removed by a selective etchant (for example, 100 parts phosphoric acid (concentrated), 10 parts ascetic acid (concentrated), and 1 part nitric acid (concentrated)) prior to the silicon pit etching, thus undercutting the microbridge with a thin 400 angstrom space. This 400 angstrom space does not provide adequate thermal isolation by itself. Such isolation is provided by the 3000 times deeper etch pit.

The aluminum etchant does not attack either the silicon or the nitride microbridge structure significantly. The silicon etchant does attack the nitride somewhat, and it was not obvious prior to the invention that a thin 400 angstrom space would provide sufficient access for the etchant to remove the silicon rapidly enough to prevent damage to the nitride. We have found that the action is sufficiently fast to avoid nitride damage. Once the 400 angstrom space is slightly deepened, the silicon anisotropic etchant smooths the surface beneath the bridge into a continuous (100) plane which then etches quickly downward at all points simultaneously within the constraints of the extending (111) planes on the sloping sides of the pit.

The result is an accurately dimensioned pit bounded on all four sides by sloping (111) etchresistant planes, and on the bottom by a (100) plane at a depth determined by the time interval in the etchant if the diamond-shaped pit is not completed. The exact length of the microbridge is determined by the original aluminum delineation, and is not a function of the etching time to any appreciable extent. Thus the thermal isolation is more accurately determined for the orthogonally oriented microbridge, and a smaller area is required to form the pit.

In other words the front surface fabrication is accomplished by using the thin film sacrificial layer of aluminum, typically 400 angstroms thick, to define the top surface of the thermal isolation pit in the silicon. After all other depositions are finished, the previously described aluminum is removed by an acid etchant (it does not affect silicon) which is applied through the narrow slots in the silicon nitride web, such slots being located near the edge of the web and away from the hot part of the web. Locating the slots near the diaphragm edge permits heating the heater to a high temperature without concern for damaging the polyimide at the cool slot locations. After the aluminum has been removed, an anisotropic KOH alkaline etchant is applied through the slots to anisotropically etch the pit in the silicon substrate to the desired depth. This depth may be about 100 microns. After this step, the 2 to 4 microns wide slots are closed by applying a polyimide solution of proper viscosity to flow over the wafer surface, filling and covering the slots with a thin, micron-thick layer of chemically inert polyimide which does not appreciably enter the cavity. Subsequently, the polyimide is removed from all areas except the neighborhood of the slots by a photo-delineation process. One example of a suitable polyimide is Probimide TM 285, a 200 series pre-imidized polyimide manufactured by Ciba-Geigy. This material is designed for use as an interlayer dielectric. It can be spun-on with a high degree of planarization, and hard baked (350°-450° C.), to yield a thin (1-2 micron thick) film.

Delineation of this polyimide film can be effected using an SiO2 mask and reactive ion etching (RIE). Mask features can be replicated to close tolerances. Straight side walls results with little, if any, undercutting. Polyimide web features as fine as 1-2 microns can be delineated using standard photolithographic technology. Subsequently, the heater power can be raised to burn off any top surface contamination if desired. The polyimide will remain relatively cool since it is only at the slots at the edges of the web and close to the silicon substrate.

The edges of the sacrificial aluminum layer are oriented orthogonally to the <110> directions in the (100) silicon surface to prevent unwanted undercutting of the silicon nitride outside the boundary of the web. Thus the aluminum area precisely defines the pit area with edges of both the pit and the chip being perpendicular to the air flow direction. The heater lines are likewise perpendicular to the air flow. The perpendicularity conditions minimize effects of small variations in chip orientation that may occur with prior art 45 degree oriented structures at high velocities of flow, and also simplify positioning the chip during the packaging process.

The preferred embodiment of the figures may be modified slightly by adding a thin film of metal, such as NiFe, to the surface of the final layer 16 of silicon nitride. Silicon nitride is a strong material but it is somewhat brittle and the addition of a ductile metal film enhances the strength of the combination. This combination has tradeoffs and is not the preferred embodiment since the metal increases the thermal conductance of the structure resulting in a reduced response under air flow conditions.

SUMMARY OF FABRICATION STEPS

A summary of the main fabrication steps described above is as follows:

1. Deposit and delineate the 400 angstrom layer of sacrificial aluminum on the (100) silicon surface.
2. Deposit about 5000 angstroms of silicon nitride.
3. Deposit and delineate bonding pads, the heater resistor, detector resistors, and circuit resistors.
4. Deposit about 5000 angstroms of nitride.
5. Cut pad areas and slots in the web through the nitride.
6. Build pad areas to desired gold metal thickness for bonding.
7. Etch out the aluminum.
8. Etch out the thermal isolation pit.
9. Apply and delineate polyimide film to close off the slots.

The embodiments of the invention in which an exclusive property or right is claimed are defined as follows:

1. An intermediate structure formed in the fabrication process of a thin film microsensor for airflow comprising:

a single crystal (100) silicon wafer having a (100) planar surface and having a <110> direction lying in said (100) planar surface;

a sacrifical thin film layer of aluminum on said (100) planar surface, said aluminum having a thickness of about 400 angstroms, said aluminum being delineated in a rectangular shape having edges one of said edges of the aluminum rectangle being oriented substantially orthogonally to the <110> direction;

a thin film layer of silicon nitride on the aluminum and the remainder of the silicon surface;

a thin film resistive heater element on said silicon nitride layer and centered over said aluminum layer;

first and second thin film resistive flow detector elements on said silicon nitride layer, one one each side of said heater element, said detector elements being located over said aluminum layer;

another thin film layer of silicon nitride over said heater and detector elements and the earlier mentioned silicon nitride layer;

a plurality of narrow slots formed through said silicon nitride to said aluminum, said slots being positioned to be near but spaced from the edges of the aluminum and also positioned away from said heater element.

2. The structure according to claim 1 in which the delineated aluminum is in the shape of a square about 325 microns on a side.

3. The structure according to claim 1 in which each of the silicon nitride layers is in the range of 2000-7000 angstroms in thickness.

4. The structure according to claim 3 in which each of the silicon nitride layers is about 5000 angstroms in thickness.

5. The structure according to claim 1 in which said narrow slots are in the range of 2-4 microns wide.

6. The structure according to claim 1 in which said aluminum is on the order of 400 angstroms in thickness.

7. An intermediate structure formed in the fabrication process of a thin film microsensor for airflow comprising:
- a single crystal (100) silicon wafer having a (100) planar surface and having a <110> direction lying in said (100) planar surface;
- a sacrifical thin film layer of aluminum on said (100) planar surface, said aluminum having a thickness of about 400 angstroms, said aluminum being delineated in a rectangular shape having edges, one of said edges of the aluminum rectangle being oriented substantially orthogonally to the <100> direction;
- a thin film layer of silicon nitride on the aluminum and the remainder of the silicon surface;
- a thin film resistive heater element on said silicon nitride layer and centered over said aluminum layer;
- first and second thin film resistive flow detector elements on said silicon nitride layer, one one each side of said heater element, said detector elements being located over said aluminum layer;
- another thin film layer of silicon nitride over said heater and detector elements and the earlier mentioned silicon nitride layer;
- a plurality of narrow slots formed through said silicon nitride to said aluminum, said slots being positioned to be near but spaced from the edges of the aluminum and also positioned away from said heater element.

* * * * *